(12) United States Patent
Barratt

(10) Patent No.: US 10,536,136 B2
(45) Date of Patent: Jan. 14, 2020

(54) MODIFIED DIGITAL FILTERING WITH SAMPLE ZONING

(71) Applicant: Lachlan Paul Barratt, Summer Hill (AU)

(72) Inventor: Lachlan Paul Barratt, Summer Hill (AU)

( * ) Notice: Subject to any disclaimer, the term of this patent is extended or adjusted under 35 U.S.C. 154(b) by 402 days.

(21) Appl. No.: 15/301,383

(22) PCT Filed: Apr. 1, 2015

(86) PCT No.: PCT/AU2015/000197
§ 371 (c)(1),
(2) Date: Oct. 1, 2016

(87) PCT Pub. No.: WO2015/149115
PCT Pub. Date: Oct. 8, 2015

(65) Prior Publication Data
US 2017/0194941 A1   Jul. 6, 2017

Related U.S. Application Data

(60) Provisional application No. 61/974,326, filed on Apr. 2, 2014, provisional application No. 62/056,337, filed on Sep. 26, 2014.

(51) Int. Cl.
*H03H 17/02* (2006.01)
*H04R 3/04* (2006.01)

(52) U.S. Cl.
CPC .... *H03H 17/0201* (2013.01); *H03H 17/0213* (2013.01); *H03H 17/0294* (2013.01); *H04R 3/04* (2013.01); *H03H 2218/14* (2013.01)

(58) Field of Classification Search
CPC ............... H03H 17/0201; H03H 17/02; H03H 17/0213; H03H 17/0294;
(Continued)

(56) References Cited

U.S. PATENT DOCUMENTS

| 5,272,656 A * | 12/1993 | Genereux | .......... H03H 21/0012 706/22 |
| 6,333,763 B1 | 12/2001 | Tanaka | |
| 8,488,800 B2 | 7/2013 | Crockett | |

FOREIGN PATENT DOCUMENTS

| WO | 2014/153604 A1 | 10/2014 |
| WO | 2014/153605 A1 | 10/2014 |

(Continued)

*Primary Examiner* — David L Ton
(74) *Attorney, Agent, or Firm* — Maschoff Brennan

(57) ABSTRACT

The present invention relates broadly to a method of digitally filtering a signal, such as an audio signal, using a digital filter. The digital filter includes a plurality of neighbouring sample points broken into zones having different frequency content or frequency ranges. The zones adjacent one another may have neighbouring sample points in common. Generally each zone has at least same distinct frequencies compared with other zones. That is, the zones are roughly dependent on the frequency content. The invention in its preferred form involves combining values for two or more of the neighbouring sample points for select of the zones depending on its frequency content. The values are combined so as to provide a modified zone having substantially the same number of sample points as the select zone. The modified zones together provide a modified filter to be applied to the signal.

9 Claims, 13 Drawing Sheets

(58) Field of Classification Search
CPC .... H03H 2017/0072; H04R 3/04; H03G 5/16; H03G 5/165; H03G 5/18; H03G 5/22
See application file for complete search history.

(56) References Cited

FOREIGN PATENT DOCUMENTS

| | | |
|---|---|---|
| WO | 2014/153606 A1 | 10/2014 |
| WO | 2014/153607 A1 | 10/2014 |
| WO | 2014/153609 A1 | 10/2014 |

* cited by examiner

Figure 9

MODIFIED DIGITAL FILTERING WITH SAMPLE ZONING

This application claims priority from U.S. provisional patent application Nos. 61/974,326 and 62/056,337 filed on 2 Apr. 2014 and 26 Sep. 2014, respectively. This application is also related to and if required claims priority from U.S. patent application Nos. 62/056,343, 62/056,349 and 62/056,345 filed on 26 Sep. 2014 together with U.S. provisional patent application Nos. 62/091,327, 62/091,328 and 62/091,312 filed on 12 Dec. 2014. The contents of these provisional applications are to be taken as incorporated herein by these references.

TECHNICAL FIELD

The present invention relates broadly to a method of digitally filtering a signal such as an audio signal in audio equalisation (EQ). The invention also relates broadly to a computer system for digitally filtering a signal, and a computer or device-readable medium including instructions for digitally filtering a signal. The invention extends to filtering audio signals and other signals including images and signals associated with digital communications and processing.

BACKGROUND OF INVENTION

In digital recording and playback an analog signal representative of audio is converted into a digital signal which lends itself to manipulation and storage. The conversion is performed in an analog to digital converter (ADC). The stored digital signal can be converted back to an analog signal in a digital to analog converter (DAC). The analog signal is played back using conventional audio equipment such as amplifiers and speakers. The digital signal can be manipulated prior to the DAC to improve its quality before playback. This manipulation includes audio EQ where selected parts of the frequency spectrum of the audio are filtered to, for example, compensate for irregularities in the frequency response. The audio may also be filtered to resolve problems from its conversion into a digital signal or back to an analog signal.

These applications of digital filtering require relative high microprocessor or CPU speeds at high sample rates for high definition conversion or manipulation. This can slow operation of the CPU and associated computer hardware to unacceptable speeds.

SUMMARY OF INVENTION

According to a first aspect of the present invention there is provided a method of digitally filtering a signal, said method comprising the steps of:
  providing a filter including a plurality of neighbouring sample points arranged generally in zones of different frequency content;
  for select of the zones depending on its frequency content, combining values for two or more of the neighbouring sample points within each of the select zones to provide a modified zone having substantially the same number of sample points as the select zone;
  deriving a modified filter from the modified zones;
  applying the modified filter to the signal.

According to a second aspect of the invention there is provided a method of digitally filtering a filter, said method comprising the steps of:
  providing another filter including a plurality of neighbouring sample points arranged generally in zones of different frequency content;
  for select of the zones depending on its frequency content, combining values for two or more of the neighbouring sample points within each of the select zones to provide a modified zone having substantially the same number of sample points as the select zone;
  deriving a modified filter from the modified zones;
  applying the modified filter to the filter.

Preferably the step of combining values for the neighbouring sample points for said select of the zones involves combining two or more common sample points from the neighbouring sample points of the select zone. More preferably the common sample points combined in the modified zone are overlapping of the neighbouring sample points from the select zone. Even more preferably the same number of the neighbouring sample points are combined from the select zone to provide the modified zone.

Preferably the step of combining values for the neighbouring sample points within each of the select zones involves summing values for the sample points. More preferably the summed values are adjusted by a divisor proportional to the number of sample points combined in obtaining the modified zone.

Preferably the method comprises additional steps of:
  combining values for two or more of neighbouring sample points within at least one of the modified zones to provide an additional modified zone having substantially the same number of sample points as said modified zone;
  deriving an additional modified filter from the additional modified zone;
  applying the additional modified filter to the signal.

More preferably the method further comprises repeating the preceding steps for said at least one of the zones in a cascade.

Preferably the number of values combined for the neighbouring sample points progressively increases for neighbouring of the zones as the required resolution for the zone decreases.

Preferably the filter is represented by an impulse response produced by an impulse fed to the filter wherein the step of combining values for sample points within each of the select zones involves a dot product of the impulse response with the signal to derive filter values for the modified filter to be applied to the signal or filter.

Preferably the method comprises a preliminary step of applying a frequency threshold filter to the filter to retain one or more of the plurality of zones only at or below a predetermined threshold frequency.

Preferably the filter includes a central zone and a plurality of neighbouring zones either side of the central zone wherein sample points are not combined for relatively high resolution signal processing in the central zone at relatively high frequencies. More preferably in the plurality of neighbouring zones, the number of sample points combined are increased for progressively lower resolution signal processing at relatively low frequencies compared with the central zone. Even more preferably the method also comprises the step of applying each of other samples of at least one other of the plurality of zones of the filter where samples are not combined to corresponding sample values of a corresponding zone of the signal.

According to a third aspect of the invention there is provided a computer or device-readable medium including instructions for digitally filtering a signal using a filter including a plurality of neighbouring sample points arranged generally in zones of different frequency content, said instructions when executed by a processor cause said processor to:
  for select of the zones depending on its frequency content, combine values for two or more of the neighbouring sample points within each of the select zones to provide a modified zone having substantially the same number of sample points as the select zone;
  derive a modified filter from the modified zones;
  apply the modified filter to the signal.

According to a fourth aspect of the invention there is provided a computer or device-readable medium including instructions for digitally filtering a filter using another filter including a plurality of neighbouring sample points arranged generally in zones of different frequency content, said instructions when executed by a processor cause said processor to:
  for select of the zones depending on its frequency content, combine values for two or more of the neighbouring sample points within each of the select zones to provide a modified zone having substantially the same number of sample points as the select zone;
  derive a modified filter from the modified zones;
  apply the modified filter to the filter.

According to a fifth aspect of the invention there is provided a computer system for digitally filtering a signal, said computer system comprising:
  a filter including a plurality of neighbouring sample points arranged generally in zones of different frequency content;
  a processor configured to:
    for select of the zones depending on its frequency content, combine values for two or more of the neighbouring sample points within each of the select zones to provide a modified zone having substantially the same number of sample points as the select zone;
    derive a modified filter from the modified zones;
    apply the modified filter to the signal.

According to a sixth aspect of the invention there is provided a computer system for digitally filtering a filter, said computer system comprising:
  another filter including a plurality of neighbouring sample points arranged generally in zones of different frequency content;
  a processor configured to:
    for select of the zones depending on its frequency content, combine values for two or more of the neighbouring sample points within each of the select zones to provide a modified zone having substantially the same number of sample points as the select zone;
    derive a modified filter from the modified zones;
    apply the modified filter to the filter.

According to a seventh aspect of the invention there provided a method of digitally processing an image, said method comprising the steps of:
  providing a filter including a plurality of neighbouring sample points arranged generally in zones of different frequency content;
  for select of the zones depending on its frequency content, combine values for two or more of the neighbouring sample points within each of the select zones to provide a modified zone having substantially the same number of sample points as the select filter;
  derive a modified filter from the modified zones;
  applying the modified filter to the image.

Preferably the image includes a matrix of pixels. More preferably the frequency content is derived in the spatial domain of the matrix of pixels. Even more preferably the frequency content is dependent on the frequency of change in values across neighbouring of the pixels.

According to an eighth aspect of the invention there is provided a method of digitally filtering a signal, said method comprising the steps of:
  providing a filter including a plurality of zones each having different frequencies;
  performing a sample rate decrease for at least one of the zones depending on its frequency to provide a modified filter;
  applying the modified filter to the signal.

According to a ninth aspect of the invention there is provided a method of digitally filtering a filter, said method comprising the steps of:
  providing another filter including a plurality of zones each having different frequencies;
  performing a sample rate decrease for select of the zones depending on its frequency to provide a modified filter;
  applying the modified filter to the filter.

Preferably the method comprises an additional step of combining at least two of the subset of samples to provide a further subset of the selection of samples for said at least one of the plurality of zones to be applied as the modified filter to the signal.

Preferably the step of combining at least two of the selection of samples involves combining the same number of samples for each of the zones. More preferably the number of samples combined progressively increases for neighbouring of the zones as the required resolution for the zone decreases.

Preferably adjacent of the samples within each of said at least one of the zones are combined. Alternatively common samples within each of said at least one of the zones are combined to provide the subset of the selection of samples.

In another embodiment the filter is represented by an impulse response produced by an impulse fed to the filter wherein the step of performing a sample rate decrease involves convolving the impulse response with the signal at a reduced number of sample points to derive filter values to be applied to the signal.

Preferably the method also comprises the step of adjusting filter values for the modified filter by a factor proportional to the number of samples reduced. More preferably the factor is also adjusted by a divisor proportional to the number of samples contributing to the derived filter value.

Preferably the method further comprises additional steps of repeating sample rate decreases for said at least one of the zones in a cascade to provide the modified filter.

Preferably the method comprises a preliminary step of applying a frequency threshold filter to the filter to retain one or more of the plurality of zones only at or below a predetermined threshold frequency.

Preferably the plurality of zones include a central zone and a plurality of neighbouring zones either side of the central zone wherein samples are not reduced for relatively high resolution signal processing in the central zone at relatively high frequencies. More preferably in the plurality of neighbouring zones the number of samples are reduced for progressively lower resolution signal processing at relatively low frequencies compared with the central zone. Sill more preferably the method also comprises the step of applying each of other samples of at least one other of the plurality of zones of the filter where samples are not reduced to corresponding sample values of a corresponding zone of the signal.

According to a tenth aspect of the invention there is provided a computer or device device-readable medium including instructions for digitally filtering a signal using a filter including a plurality of zones each having a different frequencies, said instructions when executed by a processor cause said processor to:

perform a sample rate decrease for at least one of the zones depending on its frequency to provide a modified filter;

apply the modified filter to the signal.

According to an eleventh aspect of the invention there is provided a computer or device-readable medium including instructions for digitally filtering a filter using another filter including a plurality of zones each having different frequencies, said instructions when executed by a processor cause said processor to:

perform a sample rate decrease for select of the zones depending on its frequency to provide a modified filter;

apply the modified filter to the filter.

According to a twelfth aspect of the invention there is provided a system for digitally filtering a signal, said system comprising:

a filter including a plurality of zones each having different frequency bands;

a processor configured to:

perform a sample rate decrease for at least one of the zones depending on its frequency to provide a modified filter;

apply the modified filter to the signal.

According to a thirteenth aspect of the invention there is provided a system for digitally filtering a filter, said system comprising:

another filter including a plurality of zones each having different frequencies;

a processor configured to:

perform a sample rate decrease for select of the zones depending on its frequency to provide a modified filter;

apply the modified filter to the filter.

Preferably the signal is an audio signal

According to a fourteenth aspect of the invention there is provided a method of digitally processing an image, said method comprising the steps of:

providing a filter including a plurality of zones each having different frequency content;

performing a sample rate decrease for select of the zones depending on its frequency to provide a modified filter;

applying the modified filter to the image.

Preferably the image includes a matrix of pixels. More preferably the frequency content is derived in the spatial domain of the matrix of pixels. Even more preferably the frequency content is dependent on the frequency of change in values across neighbouring of the pixels.

BRIEF DESCRIPTION OF DRAWINGS

In order to achieve a better understanding of the nature of the present invention a preferred embodiment of a method of digitally filtering a signal will now be described, by way of example only, with reference to the accompanying drawings in which:

FIG. 9 schematically illustrates one technique for grouping samples from a signal or filter into a plurality of zones;

DETAILED DESCRIPTION

Figure 1:
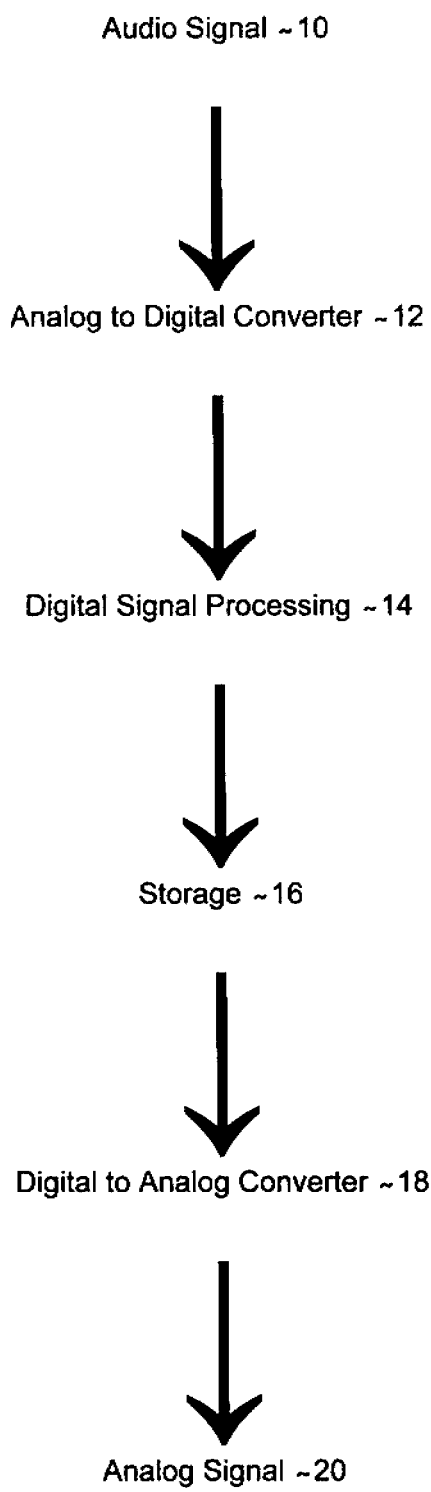
FIG. 1 is a schematic of application of embodiments of the invention in digital audio recording and playback.

FIG. 1 shows application of the various embodiments of the present invention in the course of digital audio recording and playback. The analog audio signal 10 is converted to a digital audio signal at an analog to digital converter (ADC) 12. The digital audio signal may then be subject to signal processing at digital processor 14, for example in audio equalisation (EQ). The processed digital signal is downsampled and stored at storage memory 16 before up-sampling with a sample rate increase to increase its resolution prior to playback. The relatively high resolution digital audio signal is then converted back to an analog signal 20 at a digital to analog converter (DAC) 18.

It will be understood that the various embodiments of the present invention can be applied at the digital signal processor 14 or a digital filter associated with EQ where, for example, the digital signal is filtered with a lowpass filter or bandpass filter. The invention also applies to dynamic signal processing affecting transients, such as data compression.

The present invention may be embodied in computer program code or software, typically in the form of plugin software. The digital filter of the digital signal processor is represented by a particular frequency response. The particular frequency response is generally dependent on the impulse response of the filter which is characterised by the software or techniques of the various embodiments of the present invention. Embodiments of the present invention may cover the basic types of frequency response by which digital filters are classified including lowpass, highpass, bandpass and bandreject or notch filters. The digital filters are broadly categorised as Finite Impulse Response (FIR) or Infinite Impulse Response (IIR) filters.

The present invention in its preferred embodiment is directed to a method of digitally filtering a signal, such as an audio signal, using a digital filter. It will be appreciated that the invention also extends to the application of a digital filter to another filter. The digital filter includes a plurality of neighbouring sample points broken into zones having different frequency content or frequency ranges. The zones adjacent one another may have neighbouring sample points in common. Generally each zone has at least some distinct frequencies compared with other zones. That is, the zones are roughly dependent on the frequency content. The invention in its preferred form involves combining values for two or more of the neighbouring sample points for select of the zones depending on its frequency content. The values are combined so as to provide a modified zone having substantially the same number of sample points as the select zone. The modified zones together provide a modified filter to be applied to the signal.

Figure 2:
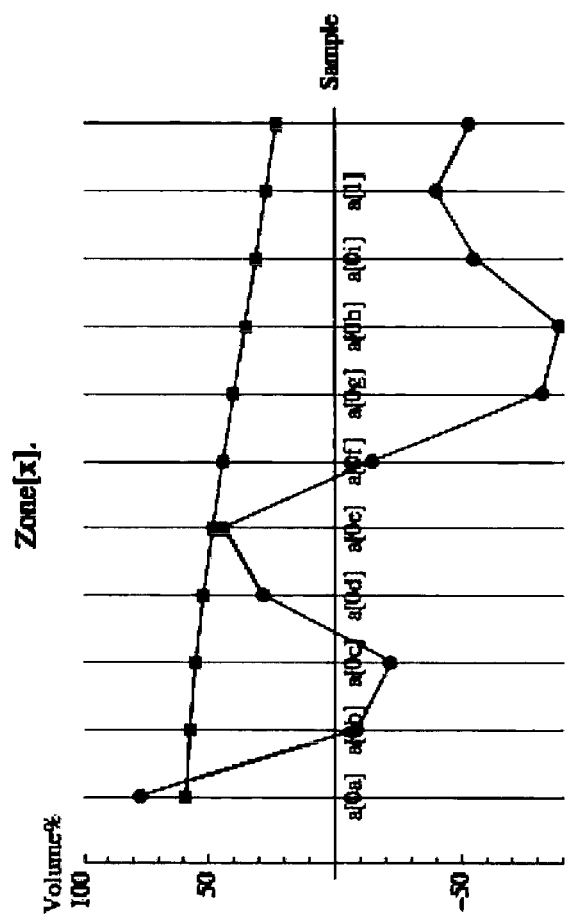
FIG. 2 is an impulse response of a signal or an audio filter extracted from different zones.

FIG. 2 illustrates variations on an audio signal sampled at the same frequency or sample rate. In this case the signal has neighbouring sample points a[0] and a[1] with nine intermediate sample points a[0a] to a[0i]. The relatively high frequency audio signal depicted in solid blue circles requires the relatively high resolution including intermediate sample points a[0a] to a[0i] for accurate representation. On the other hand, the relatively low frequency audio signal in solid maroon squares could be represented merely with the neighbouring sample points a[0] and a[1] without the intermediate sample points a[0a] to a[1i]. In its preferred form the present invention is applied to the audio signal by:
1. Zoning neighbouring sample points of for example the audio filter into a plurality of zones each having different frequency content or frequency bands; and
2. For select of the zones depending on its frequency content, combining values for groups of the neighbouring sample points to provide a modified zone having substantially the same number of sample points as the select zone;
3. Combining the modified zones to derive a modified filter.

It has been observed by the applicant that by applying this technique time smearing and/or ringing of the signal is reduced. It is understood that this is achieved in the preferred embodiments by zoning filter samples into a plurality of zones and combining values for select zones only depending on their frequency content. The values are combined in overlapping groups of the neighbouring sample points so that the modified zone has substantially the same number of sample points as the select zone. That is, adjacent of the modified zones include two or more combined values of the neighbouring sample points in common.

Figure 3:
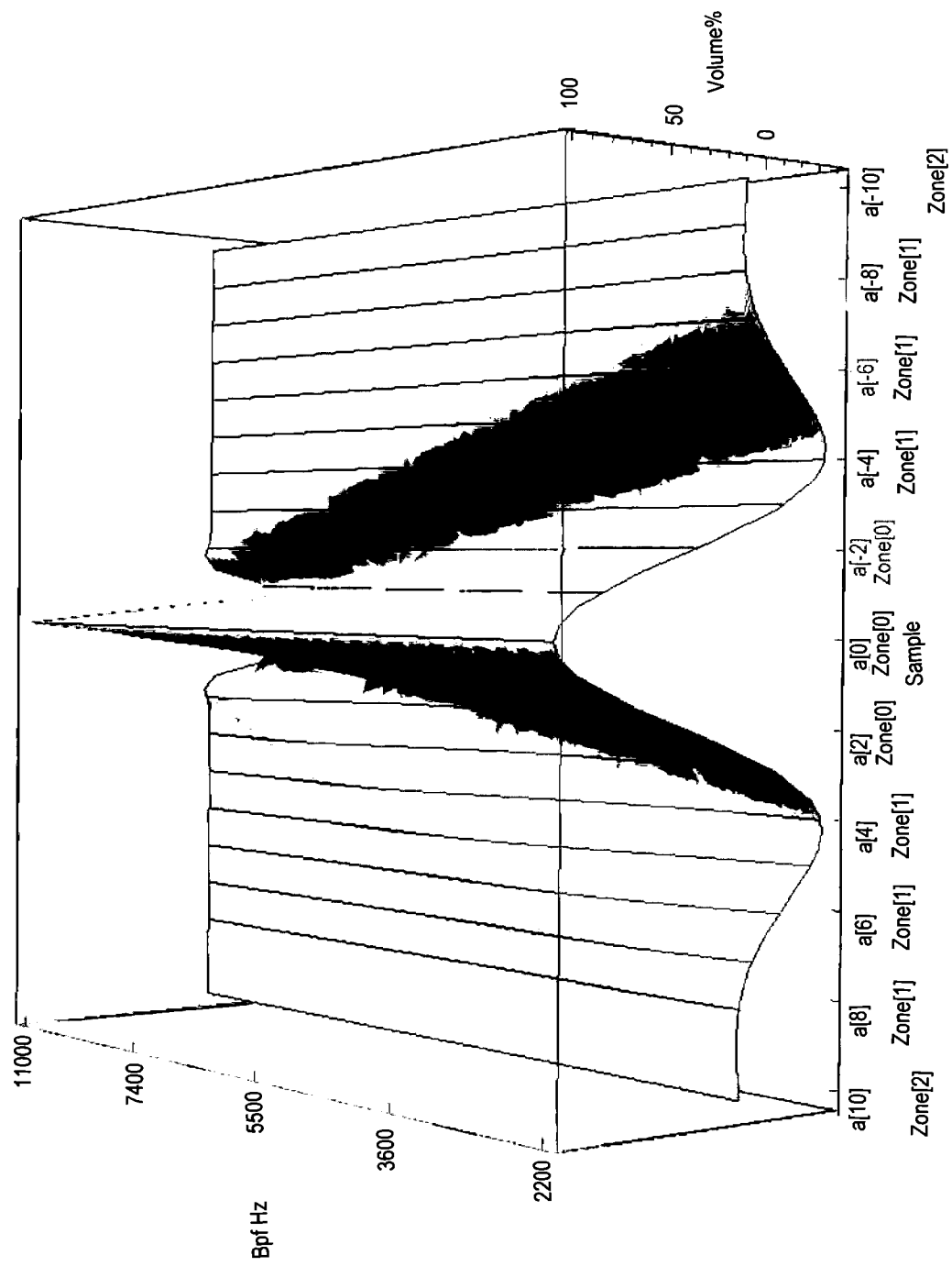
FIG. 3 is an impulse response with a third dimension at different frequencies.

FIG. 3 is an exemplary impulse response for an audio filter shown in a third dimension at various frequencies. It can be seen that higher frequency filtering in the background of this graph requires more sampling with no or reduced sample combinations for higher resolution. The lower frequencies represented in the foreground allow an increased number of overlapping sample combinations for substantially the same number of samples. This means the filter can be characterised depending on the frequency content of the audio signal wherein only zones at or below a predetermined threshold frequency are retained for filtering. This may be achieved by applying a frequency threshold filter to the filter to only retain these relatively low frequency zones.

Figure 4:
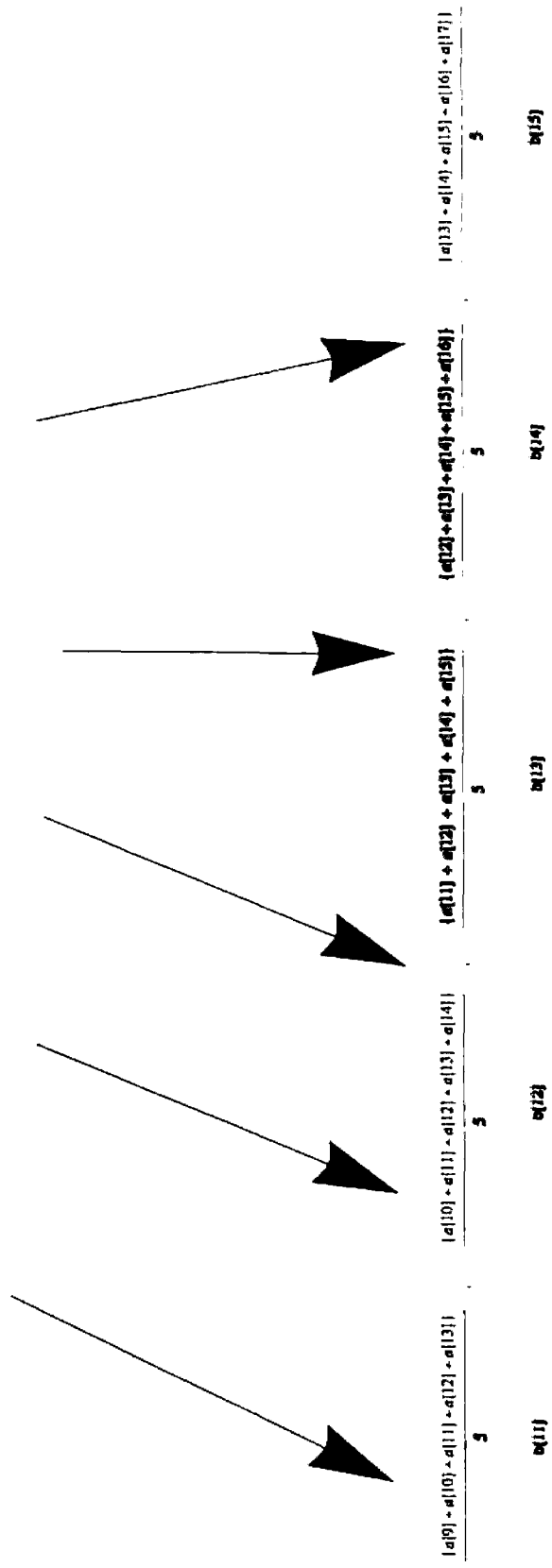
FIG. 4 schematically illustrates one technique for grouping samples from a signal or filter into a plurality of zones.

FIG. 4 schematically illustrates one technique for combining values of neighbouring sample points for a select zone [x] of a filter to provide a modified zone. For simplicity the audio filter has been limited to 25 samples a[1] to a[25]. It will be understood that depending largely on the frequency content of the audio signal to be filtered and thus the frequency ranges of the filter the number of samples will vary. The modified zone has been illustrated with five (5) values only but in practice extends to substantially the same number of values as the select zone, in this case 25 values.

In this embodiment values for overlapping groups of the neighbouring sample points are combined to provide values for the modified zone which for simplicity is shown with five (5) values only. The values in the modified zone can be designated as b[1] to b[25] corresponding to its central sample point. In this example the modified zone is arranged in overlapping groups each consisting of five (5) of the neighbouring sample points. This means b[11] is derived from the combination of values a[9] to a[13] inclusive, b[12] is derived from the combination of values a[10] to a[14] inclusive, and so on for the remaining values of the modified zone. The values for the neighbouring sample points, such as a[9] to a[13] are in this example summed. The result is then adjusted by a divisor to compensate for the number of samples grouped, in this case five (5).

The modified filter is in this embodiment derived from the combination of select zones modified together with any zones not selected for modification. The modified filter thus generally has the same number of sample points as the filter. In this example the same number of samples is combined within each of the zones. The samples are not combined in central zone(s) where relatively high resolution signal processing is required. The number of samples combined in neighbouring zones is progressively increased for lower resolution signal processing in these neighbouring zones compared with the central zone(s).

The modified audio filter constructed in accordance with this embodiment is applied to the audio signal by applying each sample of the modified zones with corresponding values of a corresponding zone of the signal. In this example the samples of the central zone(s), or any other zone which is not modified are applied to corresponding sample values of the corresponding zone of the audio signal at a relatively high resolution.

Figure 5:
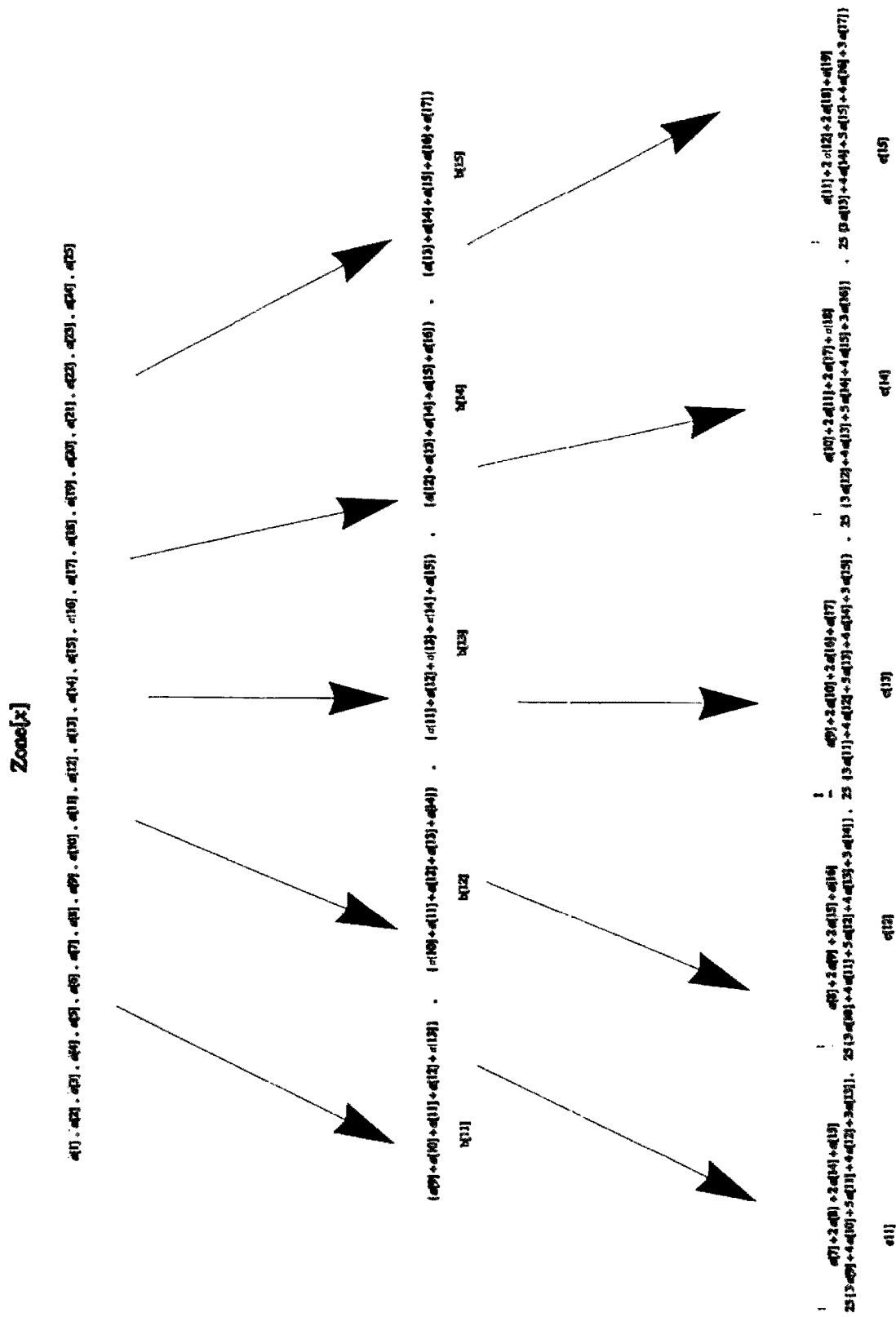
FIG. 5 is a schematic of a variation of the technique of FIG. 4.

FIG. 5 is a schematic illustration of another technique where in a cascade manner values from sample points in the modified zone are combined to derive an additional modified zone in the same manner as combining values from the select zone to derive the modified zone. In this example values in the additional modified zone can be designated as c[1] to c[25] corresponding to its central sample point. The additional modified zone is arranged in overlapping sample groups each consisting of five (5) of the sample points of the modified zone or 25 sample points of the select zone. This means c[11] is derived from the combination of values b[9] to b[13] inclusive, c[12] is derived from the combination of values b[10] to b[14] inclusive, and so on for the remaining values of the additional modified zone. It will be understood that, for example, c[11] is equivalent to the combination of values a[7], 2a[8], 3a[9], 4a[10], 5a[11], 4a[12], 3a[13], 2a[14], and a[15]. The values in this embodiment are summed and the result adjusted by a divisor to compensate for the number of samples grouped, in this case 25. The additional modified filter is obtained from the combination of additional modified zones together with any zones not selected for modification. The additional modified filter thus generally has the same number of sample points as the filter.

The filter may be represented by an impulse response produced by an impulse fed to the filter. The impulse response may be mathematically derived from a function which is obtained from the sum of the cos and/or sine components for the filter. The components for the filter are a representation of the components of the signal to which it is applied.

Figure 6:
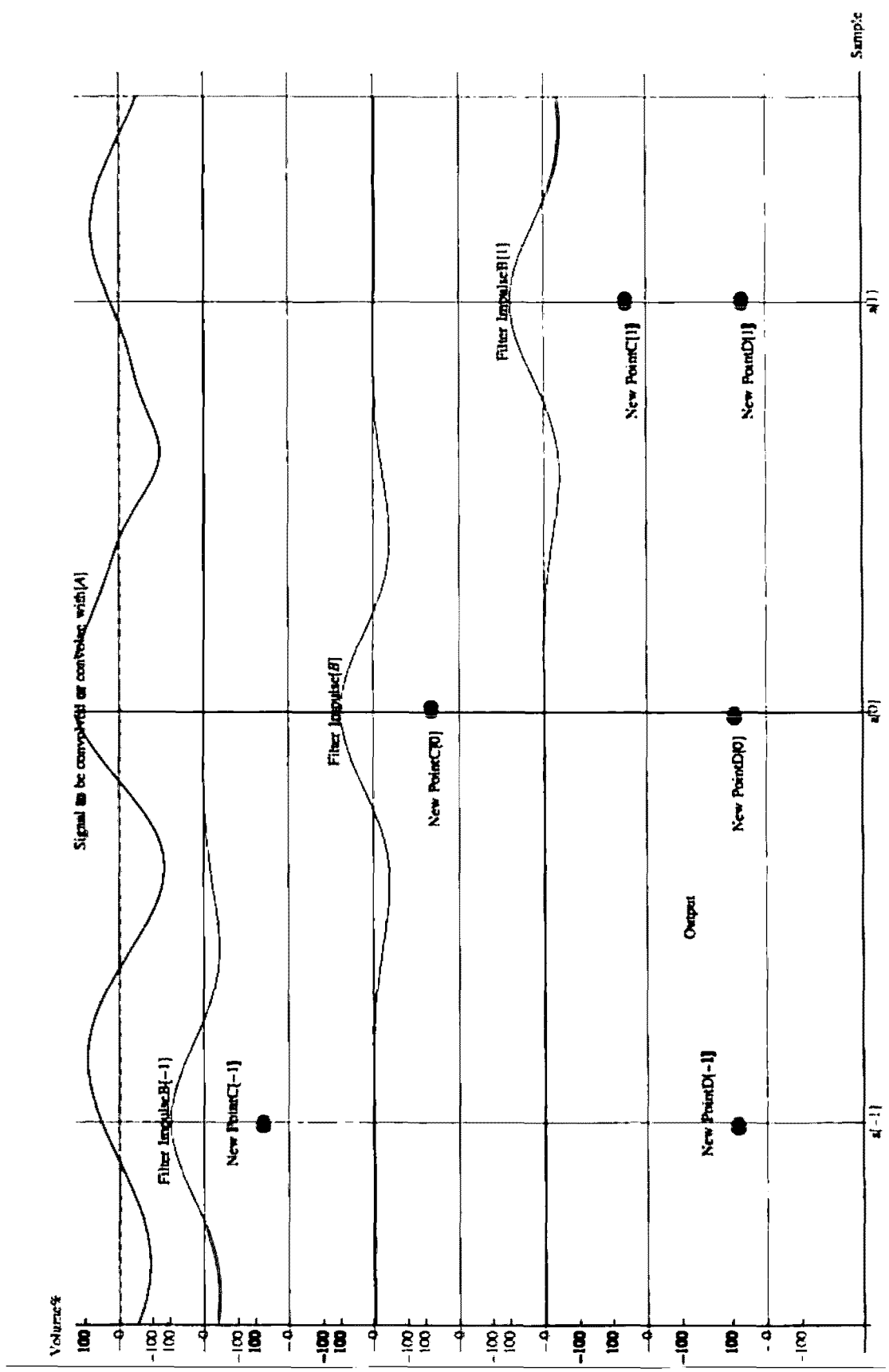
FIG. 6 is a schematic illustration of another technique where the filter is represented by an impulse response.

FIG. 6 is a schematic illustration of one exemplary technique where the impulse response is applied to the signal to derive filter values at various sample points. The application of the impulse response is in this embodiment performed by a dot product of the impulse response for that sample point with the signal from negative to positive infinity. The filter value at each of the sample points is derived from the result of the dot product.

In the illustration of FIG. 6 this technique includes at least the following steps where:
1. Impulse response B[0] is multiplied with signal S and summed across infinity to derive filter value C[0] at sample point a[0];
2. Impulse responses at sample points a[−1] and a[1] or in this case B[−1] and B[1] are each multiplied with signal S and summed across infinity to derive respective filter values C[−1] and C[1];
3. The filter values C[0], C[−1] and C[1] are directly or indirectly applied to the signal.

It will be appreciated that the derivation of filter values from the relevant impulse response may be obtained by limiting the number of points at which the impulse response is multiplied by the signal. This may involve a dot product across a limited range of sample points and/or a finite number of sample points only. The number of sample points across which the dot product is applied will generally be dictated by and proportional to the resolution. If the filters are represented by mathematical functions the filter values can be derived by integration across a finite number of samples or an infinite number of samples at infinite resolution.

The embodiments described are for ease of understanding relatively simple schemes where up to two sequential stages are described. In practice there may be multiple stages where in each subsequent stage the number of samples combined or "clumped" is increased, for example the number of samples combined is $m^n$ where m is the number of samples clumped and n is the stage of "clumping". The modified filter may thus be constructed by cascading multiple filters into one another with sample combinations at one or more of these stages. It is also possible that combining samples may involve application of a different arithmetic operator where summation is for example replaced with subtraction. The combining of samples may involve part and not necessarily all of the sample values.

Figure 7:
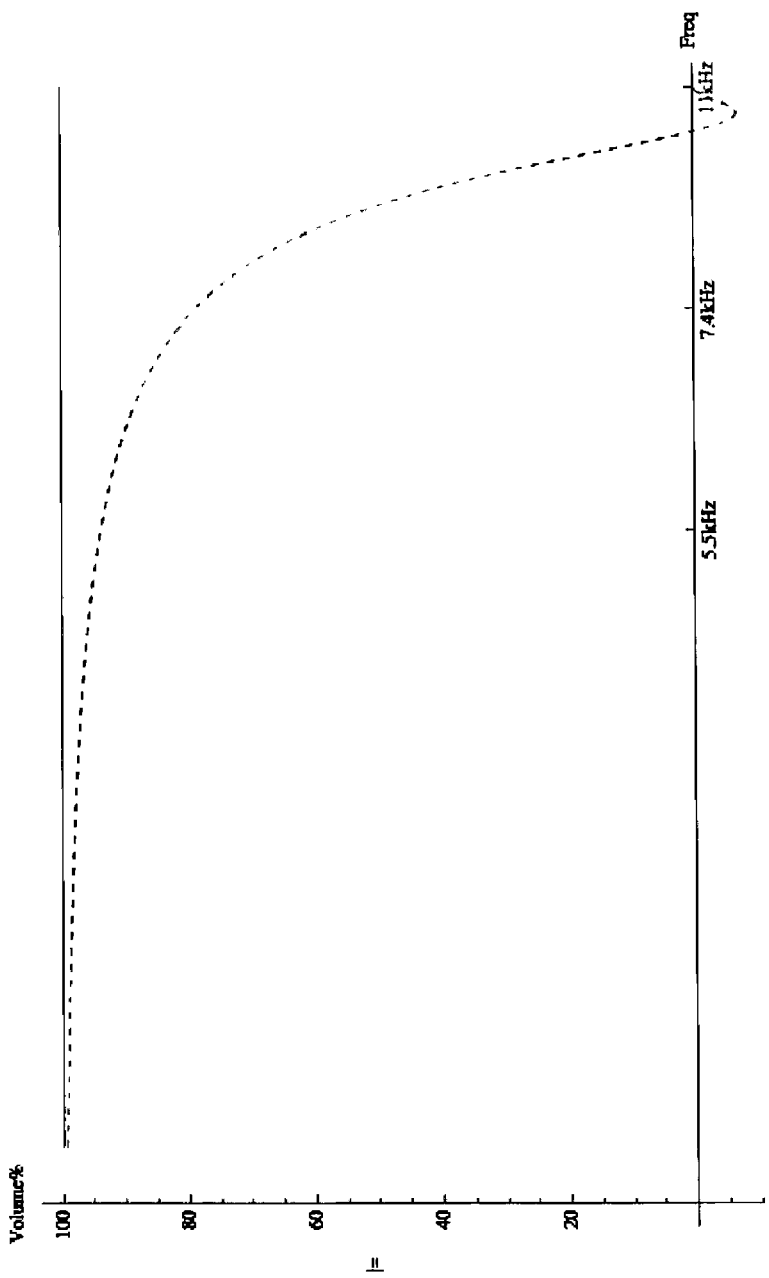
FIG. 7 is a frequency response for an exemplary filter derived from the techniques of the preceding illustrations.

FIG. 7 illustrates a frequency response for a low pass filter at or around the Nyquist frequency according to a preferred embodiment of the invention. It can be seen that the filter of this preferred embodiment functions effectively as an EQ particularly at relatively high frequencies at the high end. It provides smooth EQ particularly with a high end boost.

Figure 8:
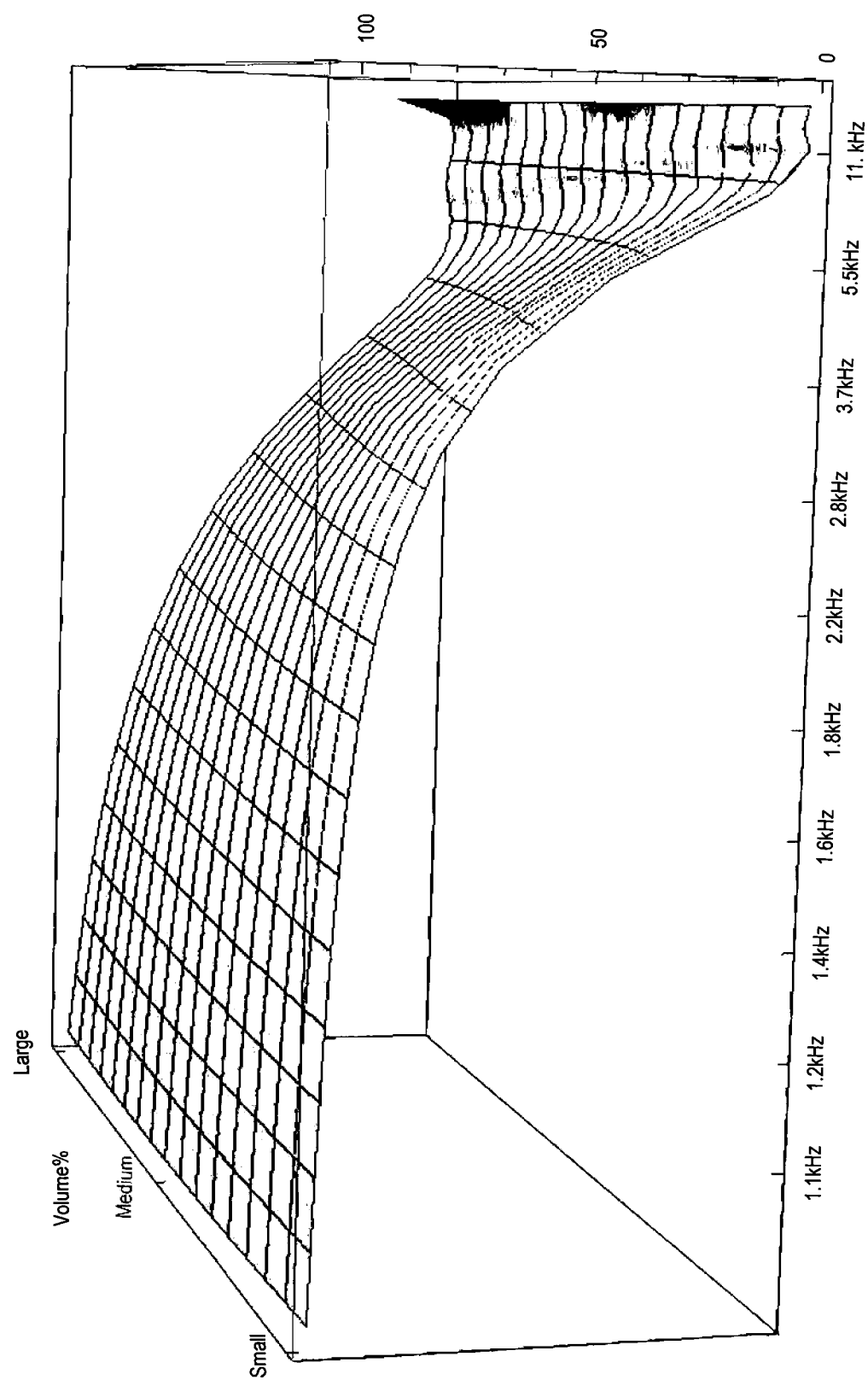
FIG. 8 is a frequency response for the filter of FIG. 7 shown at different resolutions.

FIG. 8 similarly illustrates a frequency response for a low pass filter showing the effect of the present invention in the third dimension. In this case the impact of combining samples within select of these zones by "small", "medium" or "large" amounts is illustrated. It can be seen that the filter is relatively stable when increasing the sample combinations from the foreground to the background of this graph. It can be seen that increased sample combinations shifts the Nyquist frequency to the left toward lower frequencies. The trough of the curve at the various frequencies in the z-axis roughly defines the point at which sample combinations can be performed below the shifted Nyquist frequency.

In an alternative aspect the present invention is applied to the audio signal by:
1. Grouping the samples of for example the audio filter into a plurality of zones each having different frequencies or frequency bands; and
2. Combining or reducing the number of samples from select of the zones to provide a subset of the selection of samples for application as a modified filter.

In a conventional filter the audio signal is convolved with an impulse response of the filter requiring multiplication of each point in a spectrum with each corresponding point in another spectrum. These mathematical calculations require relatively high CPU speeds and can for example slow operation of the audio EQ. On the other hand, in the preferred embodiment of the present invention the number of calculations and in particular multiplications is significantly reduced. This is achieved in the preferred embodiments by grouping filter samples into a plurality of zones and combining or reducing the number of values within each of the zones before its application as a modified filter. This technique in reducing the number of calculations or convolutions eases the "load" on the microprocessor. It has been observed that microprocessor usage has been reduced by at least 50% by adopting the methodology of the preferred embodiment. It has also been observed by the applicant that by applying this technique time smearing and/or ringing of the signal is reduced.

In one embodiment at least one of the zones includes a selection of samples and the sample rate decrease is performed where:
1. At least two of the selection of samples are combined to provide a subset of the selection of samples; and/or
2. The number of samples are reduced for at least one of the zones to provide a subset of the selection of samples.

Figure 9:
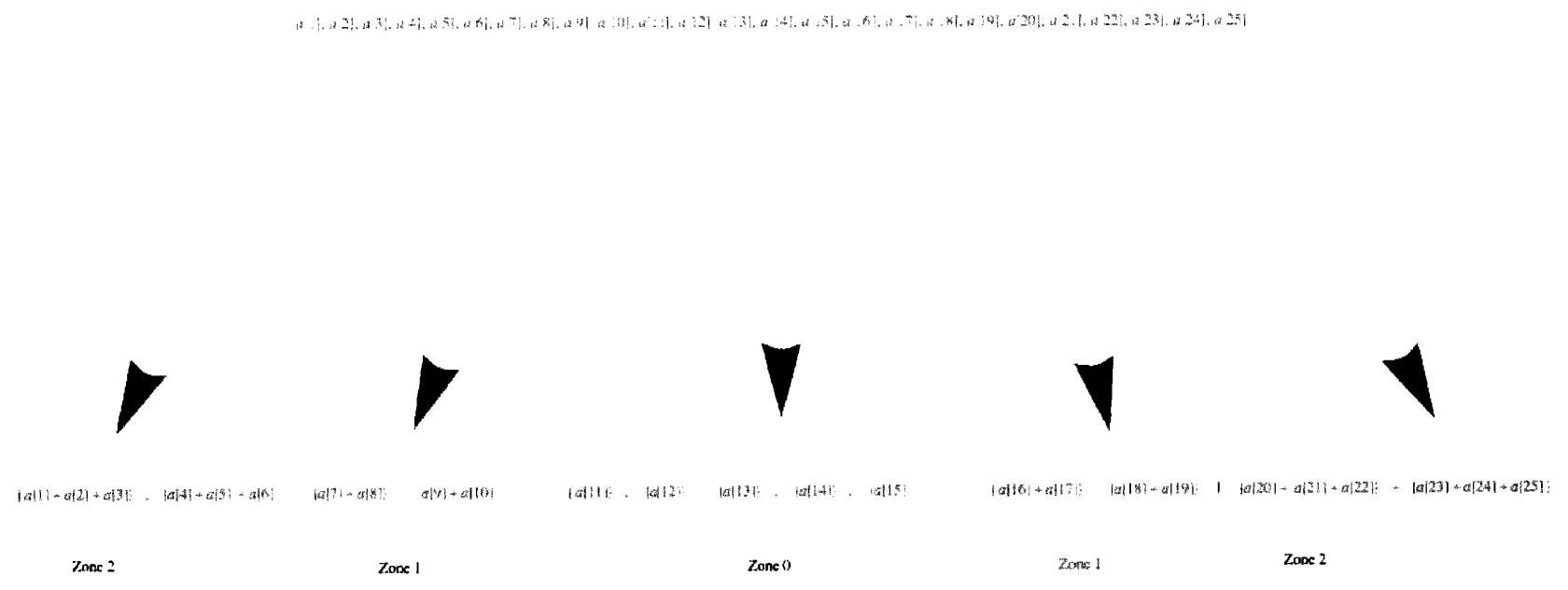

FIG. 9 schematically illustrates the technique involving combining samples to provide the subset of the selection of samples. For simplicity the audio filter has been limited to 25 samples a[1] to a[25]. It will be understood that depending largely on the frequency content of the audio signal to be filtered and thus the frequency ranges of the filter the number of samples will vary. In this embodiment the 25 samples are grouped into five zones including:
1. Central zone 0 which covers samples a[11]) to a[15];
2. Two zone 1s either side of zone 0 each having four samples nominated a[7] to a[10], and a[16] to a[19] respectively;
3. Two zone 2s either side of the respective zone 1s covering samples a[1] to a[6] and a[20] to a[25] respectively.

In this embodiment the selection of samples in zones 1 and 2 are combined to provide a subset of the selection of samples. In zone 1 two of adjacent of the samples are summed to provide the subset of the selection of samples, such as a[7]+a[8] and a[9]+a[10]. In zone 2 three of adjacent samples are summed to provide the subset of the selection of samples such as a[1]+a[2]+a[3] and a[4]+a[5]+a[6]. In this example the same number of samples is combined in each of the zones. The samples are not combined in the central zone 0 to provide relatively high resolution signal processing in this zone. The number of samples combined in the neighbouring zones is progressively increased for lower resolution signal processing in these neighbouring zones compared with the central zone.

The modified audio filter constructed in accordance with this embodiment is applied to the audio signal by applying each sample of the subset of the selection of samples with corresponding values of a corresponding zone of the signal. In this example the samples of zone 0 which are not combined are applied to corresponding sample values of the corresponding zone of the audio signal at a relatively high resolution.

Figure 10:
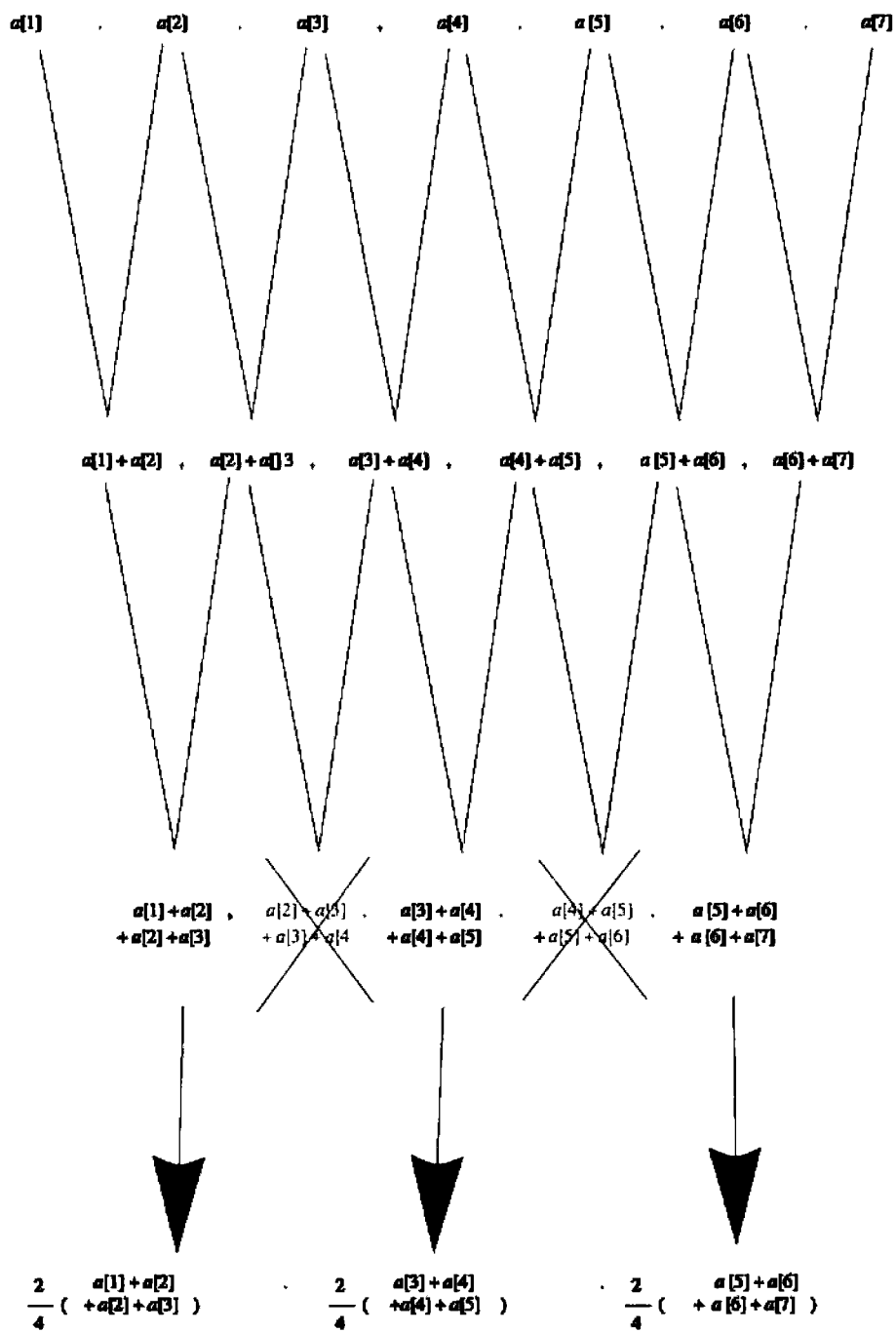
FIG. 10 is a schematic of a variation of the technique of FIG. 9 including a sample rate decrease.

FIG. 10 is a schematic illustration of an alternative technique for a sample rate decrease where:
1. Common or overlapping samples within at least one of the zones are combined to provide the subset of the selection of samples;

2. A further subset of the selection of samples are obtained by combining at least two of the subset of samples where in this case the subset of samples overlap;
3. The further subset of the selection of samples undergo a further sample rate decrease to obtain an additional subset of the samples where in this example every other of the further subset of the samples is removed.

For ease of understanding samples a[1] to a[7] are taken from any given zone where samples are to be combined. In this embodiment samples are combined in overlapping pairs where for example a[1] and a[2] are combined, and a[2] and a[3] are combined. In the same way as the previous technique the samples are combined by summing to provide the subset of the selection of samples such as a[1]+a[2]. In this alternative technique the subset of samples are then combined to provide a further subset of the samples of for example a[1]+a[2] is combined with a[2]+a[3]. The further subset of the selection of samples is thus the sequence such as (a[1]+a[2])+(a[2]+a[3]), (a[2]+a[3])+(a[3]+a[4]), (a[3]+a[4])+(a[4]+a[5]), (a[4]+a[5])+(a[5]+a[6]), and (a[5]+a[6])+(a[6]+a[7]).

In this example every other of the samples of the subset of the samples is removed to provide an additional subset of the samples. In the described embodiment this involves removal of (a[2]+a[3])+(a[3]+a[4]) and (a[4]+a[5])+(a[5]+a[6]) and retention of the three neighbouring sample points. To compensate for removing every other sample the filter values are adjusted by a factor or multiplier of two (2). Each of the retained sample points, or the additional subset of the samples, is represented by four (4) samples e.g. a[1]+a[2]+a[2]+a[3]. This means the filter values are each further adjusted by a divisor of four (4). The resulting adjustment is thus shown in FIG. 10 as coefficient "2/4".

Figure 11:
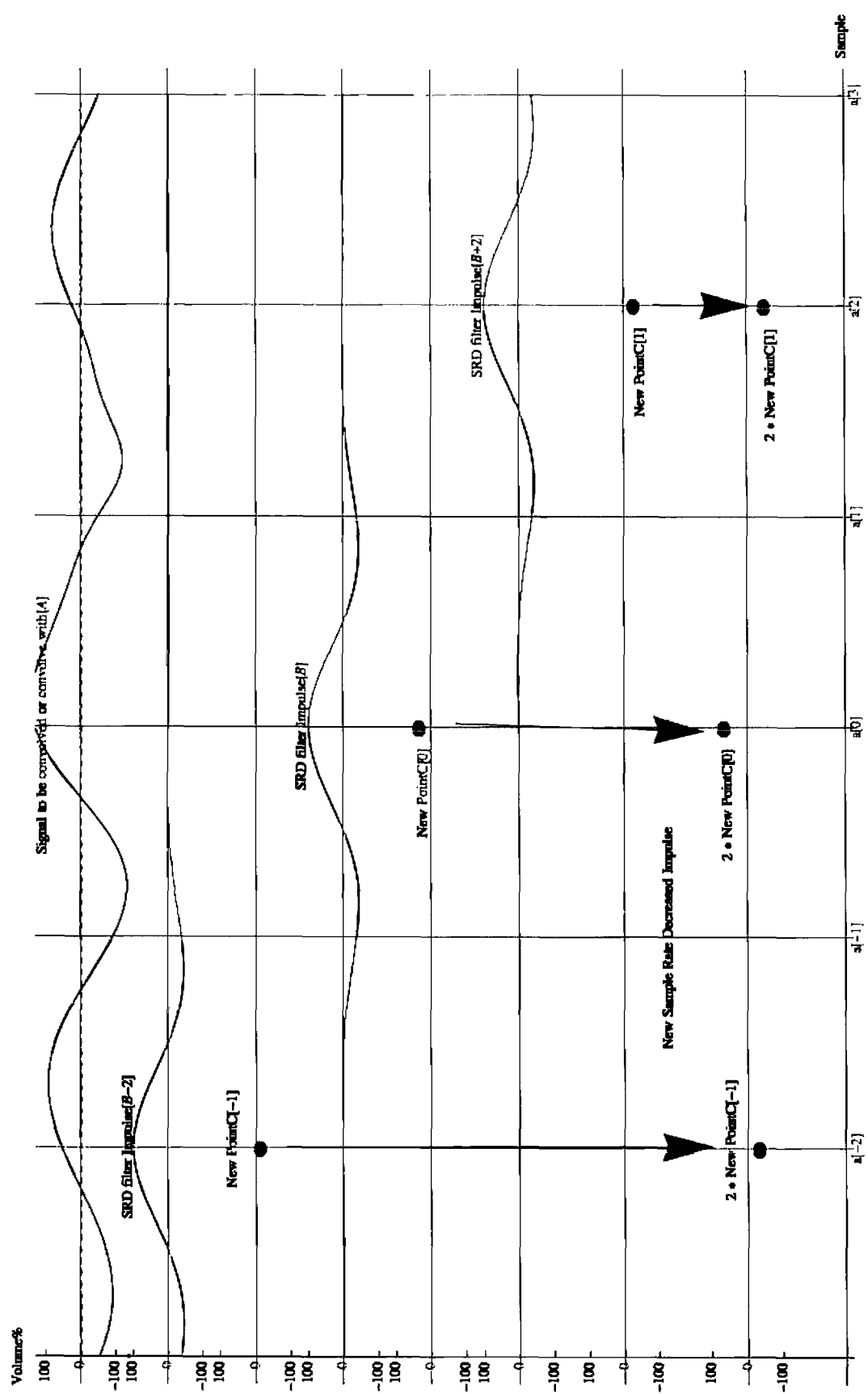
FIG. 11 is a schematic illustration of one technique for performing a sample rate decrease.

In another embodiment the sample rate decrease is performed on a filter represented by an impulse response produced by an impulse fed to the filter. FIG. 11 is a schematic illustration of one exemplary technique for performing a sample rate decrease where the impulse response is applied to the signal to derive filter values at a reduced number of sample points. The application of the impulse response at each of the reduced number of sample points is in this embodiment performed by a dot product of the impulse response for that sample point with the signal from negative to positive infinity. The filter value at each of the reduced sample points is derived from the result of the dot product.

In the illustration of FIG. 11 this embodiment is shown where:
1. Impulse response B[0] is multiplied with signal S across infinity to derive filter value C[0] at sample point a[0];
2. Sample points a[−1] and a[1] either side of sample point a[0] are ignored;
3. Impulse responses either side of a[−1] and a[1] or in this case B[−2] and B[2] are each multiplied with signal S to derive respective filter values C[−1] and C[1];
4. The filter values C[0], C[−1] and C[1] are adjusted to compensate for the sample rate decrease to obtain adjusted filter values 2*C[0], 2*C[−1] and 2*C[1].

In this embodiment the sample rate is reduced by a factor of two (2) by effectively ignoring every other sample point and its associated impulse response. This then requires an adjustment to the filter values and this adjustment is proportional to the number of samples ignored. Therefore, in this embodiment each of the filter values from which the modified filter is constructed are multiplied by a factor of two (2).

Figure 12:
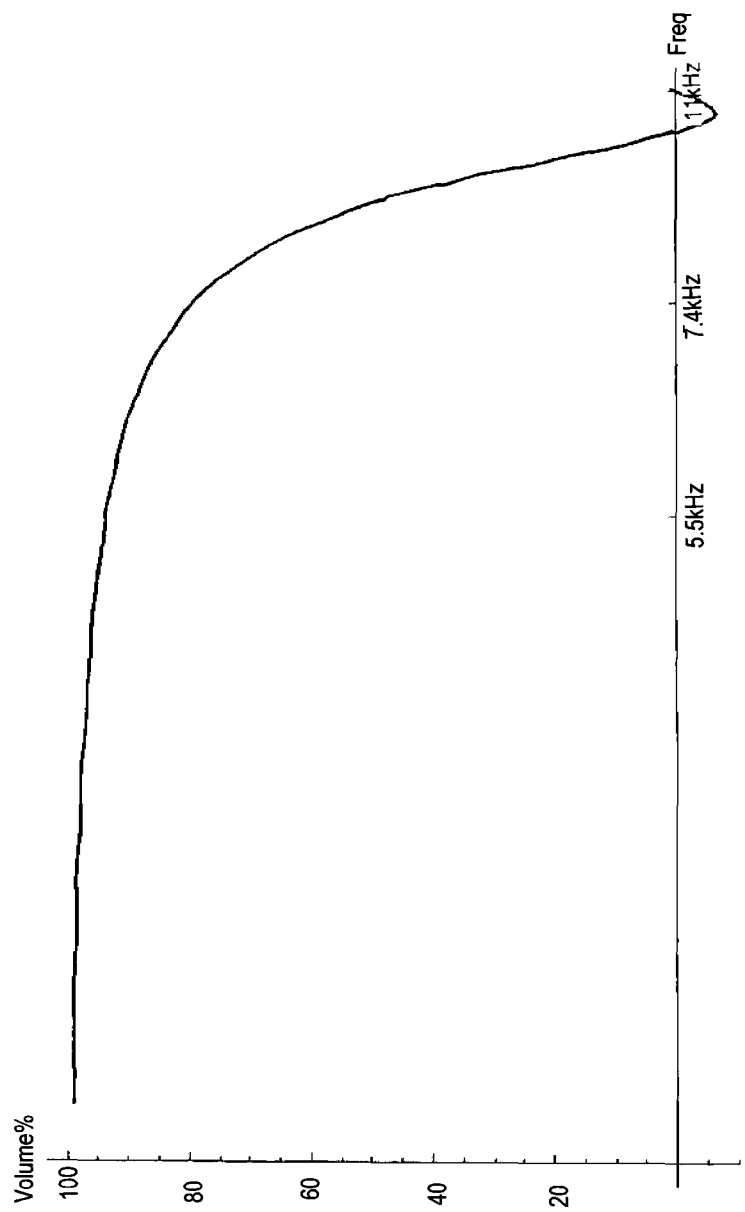
FIG. 12 is a frequency response for an exemplary filter derived from the techniques of the preceding illustrations.

FIG. 12 illustrates a frequency response for a low pass filter at or around the Nyquist frequency according to a preferred embodiment of the invention. It can be seen that the filter of this preferred embodiment functions effectively as an EQ particularly at relatively high frequencies at the high end. It provides smooth EQ particularly with a high end boost.

Figure 13:
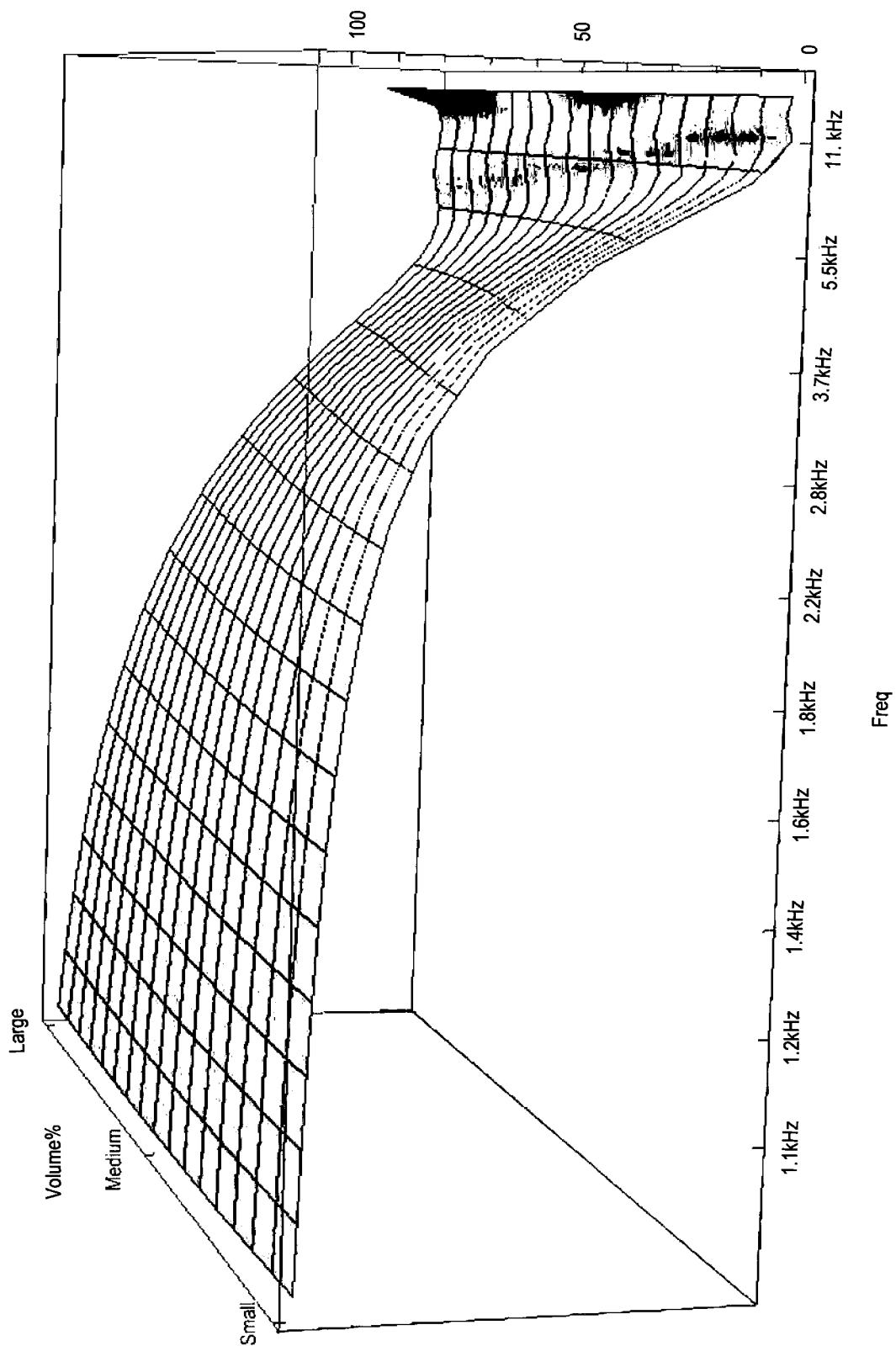
FIG. 13 is a frequency response for the filter of FIG. 12 shown at different resolutions.

FIG. 13 similarly illustrates a frequency response for a low pass filter showing the effect of the present invention in the third dimension. In this case the impact of combining or reducing samples within select of these zones by "small", "medium" or "large" amounts is illustrated. It can be seen that the filter is relatively stable when increasing the sample rate reduction from the foreground to the background of this graph. It can be seen that increased sample rate reduction shifts the Nyquist frequency to the left toward lower frequencies. The trough of the curve at the various frequencies in the z-axis roughly defines the point at which the sample rate decrease can be performed above the shifted Nyquist frequency.

The audio signal may undergo a sample rate increase where intermediate sample points are weighted according to the influence of select of the neighbouring sample points. In one embodiment the select number of neighbouring sample points used for the weighting calculation to derive the intermediate sample points is substantially proportional to the wavelength of the audio signal at the zone at which the sample rate increase is performed. For example, for low frequency audio content at outer zones a relatively small number of the neighbouring sample points are selected to calculate the weighting for example one in every four of the neighbouring sample points.

In this embodiment a predetermined number of the selected neighbouring sample points are used to calculate the weighting for the respective intermediate sample points. For example, to calculate a relatively high resolution weighting for an intermediate sample point in a high frequency zone, 1,024 sample points may be used to calculate the weighting. Alternatively the weighting may be calculated based on one or more mathematical functions applied across an infinite number of the selected neighbouring sample points.

This weighting technique for the sample rate increase when performed on the audio signal may be performed on cosine and/or sine components representative of the signal. Alternatively the sample rate increase may be performed on the filter or filter components representative of the filter. In either case when the filter is applied to or projected on the signal, the signal attains the frequency response of the filter. It is also possible that this weighting technique is used when a sample rate increase is performed on both the filter and the audio signal.

The technique by which the weighted sample rate increase is performed may vary depending on the application. In calculating the weighting the applicant intends on representing the audio signal or the filter at the select neighbouring sample points by a waveform:
1. Including cosine components each represented by absolute values of a cosine function in the time domain substantially limited to half a waveform cycle at its mid-point, see U.S. provisional patent application No. 62/056,349;
2. In its time domain represented by a sine function of absolute time values, see PCT/AU2014/000317;
3. In its time domain represented by a sinc function (sum of cosine components) for either all values or positive values only, see PCT/AU2014/000319;

4. In its time domain represented by a sine function either (i) shifted substantially one quarter of its cycle, or (ii) of values from zero to positive infinity only, see also PCT/AU2014/000318, PCT/AU2014/PCT/AU2014/000321 and PCT/AU2015/000325.

This modified weighting technique for calculating weightings for intermediate sample points may alternatively involve construction of the filter at an adjusted sampling rate where effectively the resulting filter or its representative components is weighted based on select neighbouring sample points only. This is exemplified in the applicant's co-pending international patent application no. PCT/AU2014/000325. The resulting or composite filter is constructed by convolving one filter component with another filter component at the adjusted sampling rate. This modified convolution provides the composite filter with the required virtual weighting.

It should be appreciated that the select number of the neighbouring sample points used in calculating the weighting need not be proportional to the wavelength or frequency of the audio signal or its components, or the filter components. It is possible that higher frequency content such as that included in the inner zones undergoes a sample rate increase with weighting calculated based on a reduced number of the neighbouring sample points. This will depend on for example the audio effect which is to be achieved in application of the filter, the filter components or representative components of the audio signal.

Is to be understood that the methods and techniques described can be implemented as computer-readable instructions stored on a computer-readable medium. The computer-readable instructions can be executed by a processor of practically any computer system including desktop, portable, tablet, hand-held, and/or any other computer device.

It is also to be understood that the present invention extends to computer-readable media for carrying or having computer-executable instructions stored thereon. The computer-readable media include RAM, ROM, EEPORM, CD-ROM or other optical disc storage, magnetic disc storages, or any other medium which carries or stores program code means in the form of computer-executable instructions. In the event of information being transferred or provided over a network or another communications connection to a computer, the computer is to be understood as viewing the connection (hardwired, wireless, or a combination thereof) as a computer-readable medium.

The contents of the applicant's following co-pending patent applications are to be taken as incorporated herein by these references:
1. PCT/AU2014/000317 titled "Audio Filters Utilising Sine Functions";
2. PCT/AU2014/000318 titled "Audio Sample Rate Increases";
3. PCT/AU2014/000319 titled "Audio Filtering with Virtual Sample Rate Increases";
4. PCT/AU2014/000321 titled "Audio Filtering with Adjusted Averaging Curves";
5. PCT/AU2014/000325 titled "Audio Filtering with Virtual Sample Rate Increases".

Now that several embodiments of the invention have been described it will be apparent to those skilled in the art that the method of digitally filtering a signal has at least the following advantages:
1. The filter is tailored to the audio signal and its frequency characteristics for effective filtering;
2. The methodology reduces time smearing and/or ringing in the audio signal;
3. The method provides a frequency response which is at least consistent with conventional audio EQ.

Those skilled in the art will appreciate that the invention described herein is susceptible to variations and modifications other than those specifically described.

The sample combinations may be performed on the signal, such as a compression signal, in which case the signal functions as a filter to be applied to another filter. The filter may be constructed or derived using techniques which differ from those described provided the filter can be broken or divided into frequency zones. For example, the filter may be in the form of a feed-back or feed-forward filter constructed using appropriate mathematical algorithms. The filter(s) may be constructed or represented by fast fourier transform (FFT) algorithms rather than the trigonometric functions described in the preferred embodiments, such as the cosine and/or sine components. It is also possible that convolution can be applied in the frequency domain instead of the time domain. For example filtering in the frequency domain can involve application of FFT algorithms. In the alternative aspect the sample rate decrease may be performed without combining a selection of samples but instead samples are reduced (or removed/ignored) in the select zones to provide the subset of the selection of samples.

The processing of audio signals need not be limited to acoustics but extends to other sound applications including ultrasound and sonar. The present disclosure also extends beyond audio signals to other signals including signals derived from a physical displacement such as that obtained from measurement devices, for example a strain gauge or other transducer which generally converts displacement into an electronic signal. The present disclosure also covers digital filtering of signals associated with digital communications.

The present invention can in another embodiment be applied to imaging. For example, each of the pixels in a matrix of pixels in the image is processed using a digital filter according to an embodiment of the invention. The filter is zoned in the spatial domain roughly dependent on frequency content which, for example, is measured as the frequency of change of values across neighbouring pixels within the image. If the frequency is low for any given zone the sample combinations is proportionally high for relatively low resolution processing. The filter is thus tailored to the frequency content of the image to which it is to be applied. The pixels may be provided in either a 2 or 3-D arrangement.

All such variations and modifications are to be considered within the scope of the present disclosure the nature of which is to be determined from the foregoing description.

The invention claimed is:

1. A method of digitally filtering a signal, said method comprising:
providing a filter including a plurality of neighbouring sample points arranged in a plurality of zones of different frequency content;
selecting one or more of the plurality of zones depending on the frequency content of the zone;
combining values for two or more of the plurality of neighbouring sample points within said one or more of the plurality of zones to provide a modified zone having substantially the same number of sample points as said one or more of the plurality of zones;
deriving a modified filter from the modified zone;
applying the modified filter to the signal.

2. A method as defined in claim 1 wherein combining values for two or more of the plurality of neighbouring sample points involves combining two or more common sample points neighbouring sample points of the select zone.

3. A method as defined in claim 2 wherein the common sample points combined in the modified zone are overlapping of the neighbouring sample points from the select zone, and the same number of the neighbouring sample points are combined from the select zone to provide the modified zone.

4. A method as defined in claim 1 wherein combining values for two or more of the plurality of neighbouring sample points within each of the select zones involves summing values for the sample points, and the summed values are adjusted by a divisor proportional to the number of sample points combined in obtaining the modified zone.

5. A method as defined in claim 1 further comprising:
   combining values for two or more of neighbouring sample points within at least one of the modified zones to provide an additional modified zone having substantially the same number of sample points as said modified zone;
   deriving an additional modified filter from the additional modified zone;
   applying the additional modified filter to the signal.

6. A method as defined in claim 5 further comprising repeating the steps for said at least one of the zones in a cascade manner.

7. A method as defined in claim 1 wherein the number of values combined for the neighbouring sample points progressively increases for neighbouring of the zones as the required resolution for the zone decreases.

8. A method as defined in claim 1 wherein the filter is represented by an impulse response produced by an impulse fed to the filter wherein the step of combining values for sample points within each of the select zones involves a dot product of the impulse response with the signal to derive filter values for the modified filter to be applied to the signal or filter.

9. A method of digitally filtering a filter, said method comprising:
   providing another filter including a plurality of neighbouring sample points arranged in a plurality of zones of different frequency content;
   selecting one or more of the plurality of zones depending on frequency content of the zone;
   combining values for two or more of the plurality of neighbouring sample points within said one or more of the plurality of zones to provide a modified zone having substantially the same number of sample points as said one or more of the plurality of zones;
   deriving a modified filter from the modified zone;
   applying the other filter to the filter.

* * * * *